(12) United States Patent
Hu

(10) Patent No.: US 11,916,086 B2
(45) Date of Patent: Feb. 27, 2024

(54) MANUFACTURING METHOD OF DISPLAY PANEL, DISPLAY PANEL, AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventor: Xiaobo Hu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 891 days.

(21) Appl. No.: 16/963,337

(22) PCT Filed: Jun. 3, 2020

(86) PCT No.: PCT/CN2020/094200
§ 371 (c)(1),
(2) Date: Jul. 20, 2020

(87) PCT Pub. No.: WO2021/227154
PCT Pub. Date: Nov. 18, 2021

(65) Prior Publication Data
US 2023/0147305 A1  May 11, 2023

(30) Foreign Application Priority Data
May 14, 2020  (CN) .......................... 202010408842.6

(51) Int. Cl.
*H01L 27/12* (2006.01)
*H01L 21/768* (2006.01)

(52) U.S. Cl.
CPC ...... *H01L 27/1244* (2013.01); *H01L 27/1262* (2013.01)

(58) Field of Classification Search
CPC ............. H01L 27/1244; H01L 27/1262; H01L 27/1288; H01L 27/124; H01L 29/4908; G02F 1/136209
See application file for complete search history.

(56) References Cited

U.S. PATENT DOCUMENTS

2008/0009108 A1*  1/2008  Lin ....................... H01L 29/458
                                                        257/E29.147
2012/0264260 A1  10/2012  Hu et al.
(Continued)

FOREIGN PATENT DOCUMENTS

CN       102916016 A       2/2013
CN       105789218 A       7/2016
(Continued)

OTHER PUBLICATIONS

International Search Report in International application No. PCT/CN2020/094200, dated Feb. 18, 2021.
(Continued)

*Primary Examiner* — Mohsen Ahmadi
(74) *Attorney, Agent, or Firm* — PV IP PC; Wei Te Chung; Zhigang Ma

(57) ABSTRACT

A manufacturing method of display panel, a display panel and a display device are disclosed. The manufacturing method includes following steps: providing a substrate, forming a first barrier layer on the substrate, forming a conductive layer on the first barrier layer, forming a second barrier layer on the conductive layer, forming a photoresist pattern on the second barrier layer, and then performing a
(Continued)

plasma treatment on the photoresist pattern to form a first gap between the photoresist pattern and the second barrier layer.

6 Claims, 4 Drawing Sheets

(56) References Cited

U.S. PATENT DOCUMENTS

| | | | | |
|---|---|---|---|---|
| 2013/0256668 | A1* | 10/2013 | Oh | H01L 29/78633 438/34 |
| 2013/0302938 | A1 | 11/2013 | Sato et al. | |
| 2013/0314616 | A1* | 11/2013 | Kuroda | G02F 1/136286 257/89 |
| 2015/0014680 | A1* | 1/2015 | Yamazaki | H01L 29/42384 257/43 |
| 2015/0111340 | A1 | 4/2015 | Sato et al. | |
| 2017/0104018 | A1* | 4/2017 | Yamazaki | H01L 29/78621 |
| 2019/0157499 | A1* | 5/2019 | Yamazaki | H01L 33/0041 |
| 2020/0050052 | A1* | 2/2020 | Chien | H01L 29/4908 |
| 2021/0028313 | A1* | 1/2021 | Yamazaki | H01L 29/66969 |

FOREIGN PATENT DOCUMENTS

| | | |
|---|---|---|
| CN | 106647077 A | 5/2017 |
| CN | 106653771 A | 5/2017 |
| CN | 106653772 A | 5/2017 |
| CN | 106990592 A | 7/2017 |
| CN | 110993564 A | 4/2020 |
| CN | 110998848 A | 4/2020 |
| JP | 2014016375 A | 1/2014 |
| KR | 20080022741 A | 3/2008 |

OTHER PUBLICATIONS

Written Opinion of the International Search Authority in International application No. PCT/CN2020/094200, dated Feb. 18, 2021.
Chinese Office Action issued in corresponding Chinese Patent Application No. 202010408842.6 dated Sep. 30, 2022, pp. 1-6.

* cited by examiner

MANUFACTURING METHOD OF DISPLAY PANEL, DISPLAY PANEL, AND DISPLAY DEVICE

BACKGROUND OF INVENTION

Field of Invention

The application relates to the display technical field, and particularly relates to a manufacturing method of a display panel, a display panel, and a display device.

Description of Prior Art

With development of flat-panel display technologies, people are pursuing higher and higher display sizes, resolutions and screen-refresh rates. Therefore, copper is being used to replace aluminum as a conductive metal material of choice. However, when copper films are configured as conductive layers, adhesive forces between a copper film with a glass substrate and a silicon dioxide dielectric layer are poor, particularly with low-temperature deposited silicon dioxide dielectric layers, as they are easy to peel off after high temperature processes such as annealing and so on.

In the prior art, in order to improve adhesive forces between copper films and other film layers, a three-layer copper structure is usually applied in TFT semiconductor manufacturing processes, and a barrier layer is deposited at the top and bottom of the copper films. However, in actual etching processes, there is relatively great etching selectivity between the barrier layer and copper, leading to a brim that is formed at an interface of a tapered top barrier layer and a middle copper film after etching. In subsequent dielectric layer preparation, the dielectric layer has a poor coverage of the tapered copper, resulting in cracks. Thus, it is necessary to improve this defect.

A manufacturing method of a display panel, a display panel and a display device is provided by the present application to solve technical problem that in display panels of prior art, three-layer copper structure is configured as the conductive layer, during etching processes, there is a relatively great etching selectivity between the barrier layer and copper, leading to a brim formed at an interface of a tapered top barrier layer and a middle copper after etching, in subsequent dielectric layer preparation, the dielectric layer has a poor coverage of the conductive layer, resulting in cracks of dielectric layer.

SUMMARY OF INVENTION

A manufacturing method of the display panel is provided, comprising steps of: providing a substrate; forming a first barrier layer on the substrate; forming a conductive layer on the first barrier layer; forming a second barrier layer on the conductive layer; coating a photoresist on the second barrier layer, exposing and developing the photoresist to form a photoresist pattern; performing a first wet etching on the first barrier layer, the conductive layer, and the second barrier layer to form a first protrusion on an end of the second barrier layer; performing a plasma treatment on the photoresist pattern to form a first gap between the photoresist pattern and the second barrier layer; performing a second wet etching on the first barrier layer, the conductive layer, and the second barrier layer; and stripping off the photoresist pattern.

In the manufacturing method of the display panel provided by embodiments of the present application, a material of the conductive layer is copper.

In the manufacturing method of the display panel provided by embodiments of the present application, a material of the first barrier layer is one or more of molybdenum tantalate, molybdenum titanium, molybdenum, molybdenum niobate, and molybdenum tungsten.

In the manufacturing method of the display panel provided by embodiments of the present application, a material of the second barrier layer is one or more of molybdenum tantalate, molybdenum titanium, molybdenum, molybdenum niobate, and molybdenum tungsten.

In the manufacturing method of the display panel provided by embodiments of the present application, a material of the first barrier layer and a material of the second barrier layer are same.

In the manufacturing method of the display panel provided by embodiments of the present application, the plasma treatment is performed on the photoresist pattern by bombarding the photoresist pattern with a plasma of an inert gas.

In the manufacturing method of the display panel provided by embodiments of the present application, the plasma treatment is performed on the photoresist pattern by bombarding the photoresist pattern with helium plasma or argon plasma.

In the manufacturing method of the display panel provided by embodiments of the present application, a depth of the first gap is equal to a length of the first protrusion.

A display panel is provided by embodiments of the present application, comprising a substrate, a first barrier layer disposed on the substrate, a conductive layer disposed on the first barrier layer, and a second barrier layer disposed on the conductive layer; wherein a sectional width of the first barrier layer, a sectional width of the conductive layer, and a sectional width of the second barrier layer decrease in sequence.

In the display panel provided by embodiments of the present application, a material of the conductive layer is copper.

In the display panel provided by embodiments of the present application, a material of the first barrier layer is one or more of molybdenum tantalate, molybdenum titanium, molybdenum, molybdenum niobate, and molybdenum tungsten.

In the display panel provided by embodiments of the present application, a material of the second barrier layer is one or more of molybdenum tantalate, molybdenum titanium, molybdenum, molybdenum niobate, and molybdenum tungsten.

In the display panel provided by embodiments of the present application, a material of the first barrier layer and a material of the second barrier layer are same.

A display device is provided by embodiments of the present application, comprising a driver chip and a display panel, wherein the display panel comprises a substrate, a first barrier layer disposed on the substrate, a conductive layer disposed on the first barrier layer, and a second barrier layer disposed on the conductive layer; wherein a sectional width of the first barrier layer, a sectional width of the conductive layer, and a sectional width of the second barrier layer decrease in sequence.

In the display device provided by embodiments of the present application, a material of the conductive layer is copper.

In the display device provided by embodiments of the present application, a material of the first barrier layer is one or more of molybdenum tantalate, molybdenum titanium, molybdenum, molybdenum niobate, and molybdenum tungsten.

In the display device provided by embodiments of the present application, a material of the second barrier layer is one or more of molybdenum tantalate, molybdenum titanium, molybdenum, molybdenum niobate, and molybdenum tungsten.

In the display device provided by embodiments of the present application, a material of the first barrier layer and a material of the second barrier layer are same.

In the manufacturing method of the display panel, the display panel, and the display device provided by the present application, by bombarding the photoresist with a plasma after the first wet etching, a gap is formed between the photoresist and a top barrier layer, and then performing the second wet etching to effectively remove a brim formed on the top barrier layer, phenomena such as cracks and film disconnection during subsequent preparation of the dielectric layer can be prevented, production yield can be improved.

DETAILED DESCRIPTION OF PREFERRED EMBODIMENTS

In order to make the purpose, technical scheme and effect of the present application clearer and more explicit, the present application will be further described with reference to the attached drawings and embodiments. It should be understood that specific embodiments described herein are only used to interpret the present application and are not used to restrict the present application.

Figure 1:
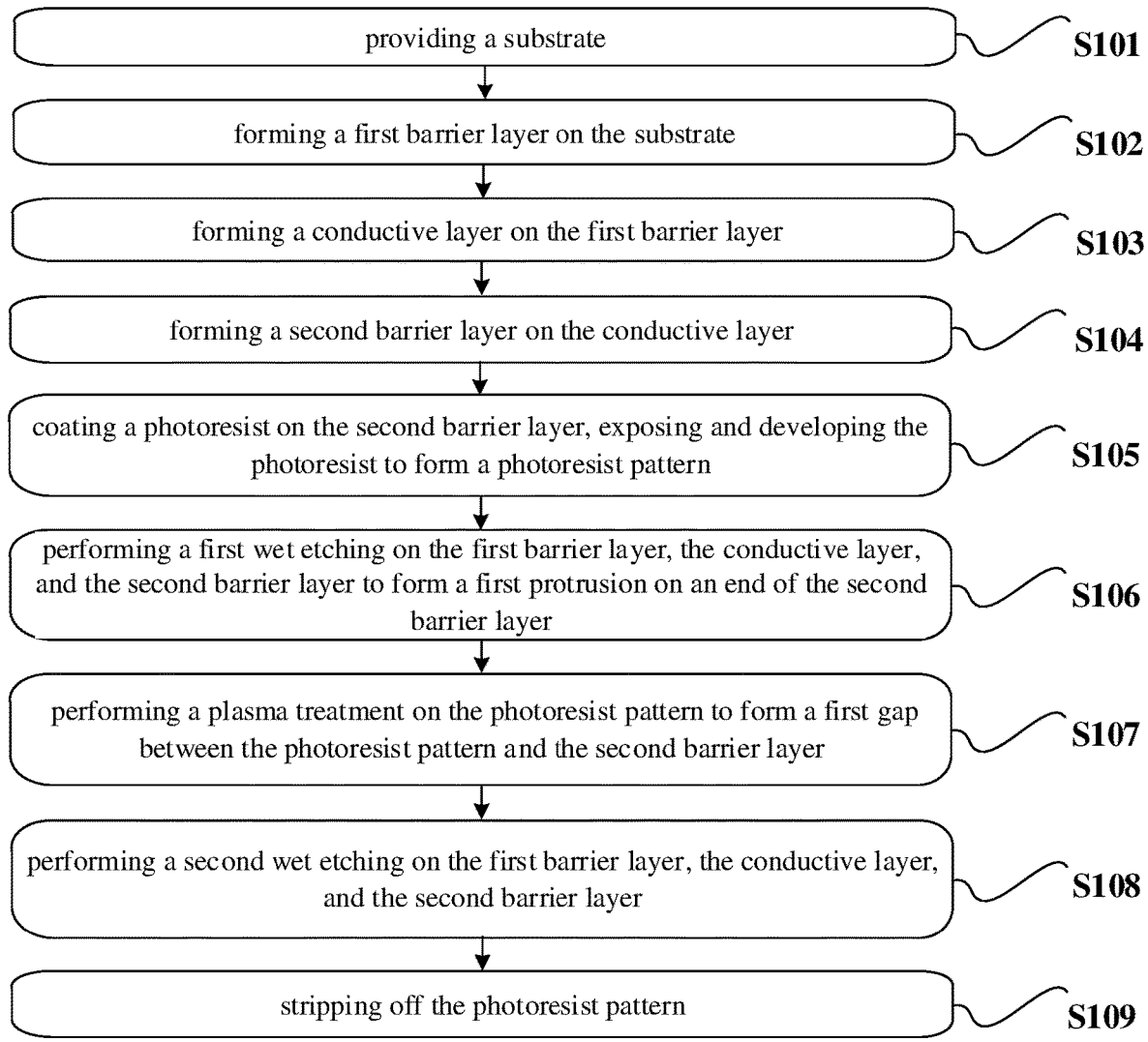
FIG. 1 is a flow chart of a manufacturing method of a display panel provided by embodiments of the present application.
Figure 2A:
FIG. 2a to FIG. 2f are process flow charts of the manufacturing method of the display panel provided by embodiments of the present application.
Figure 2B:
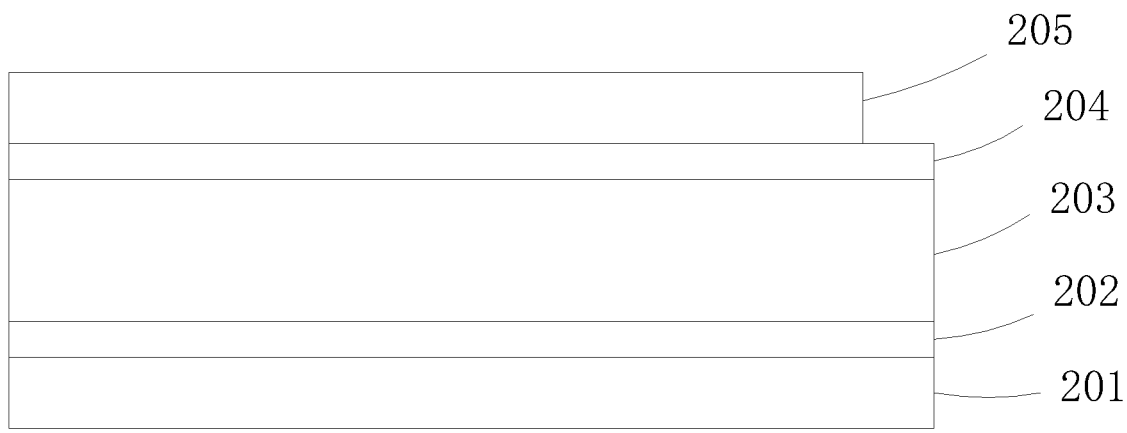
Figure 2C:
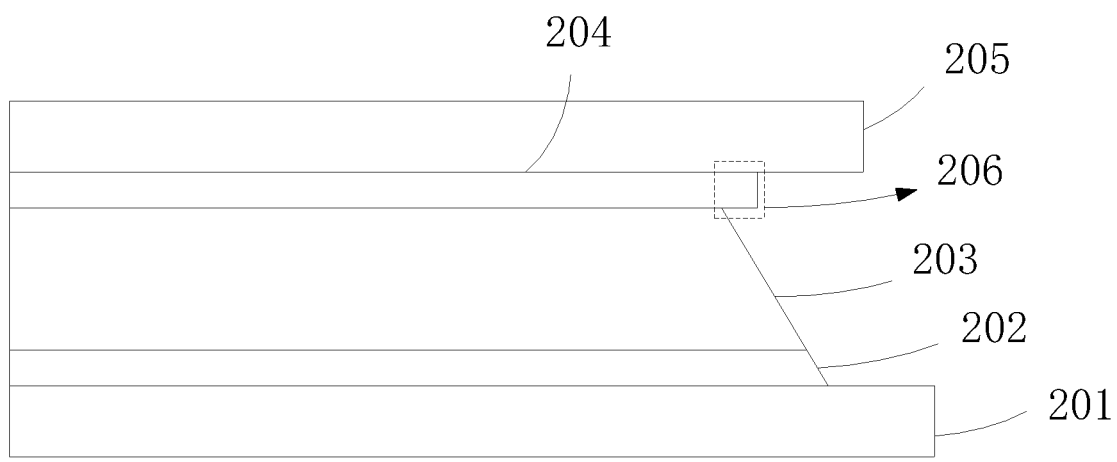
Figure 2D:
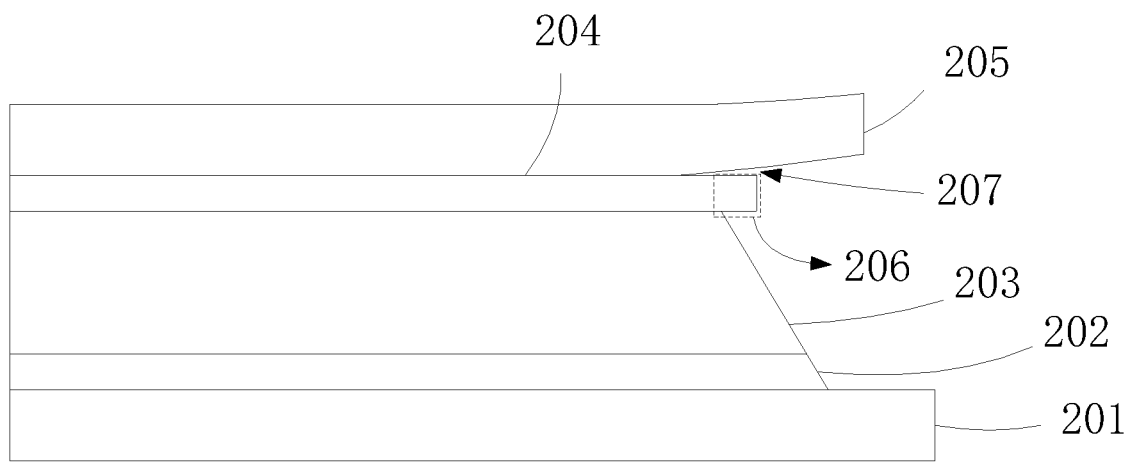
Figure 2E:
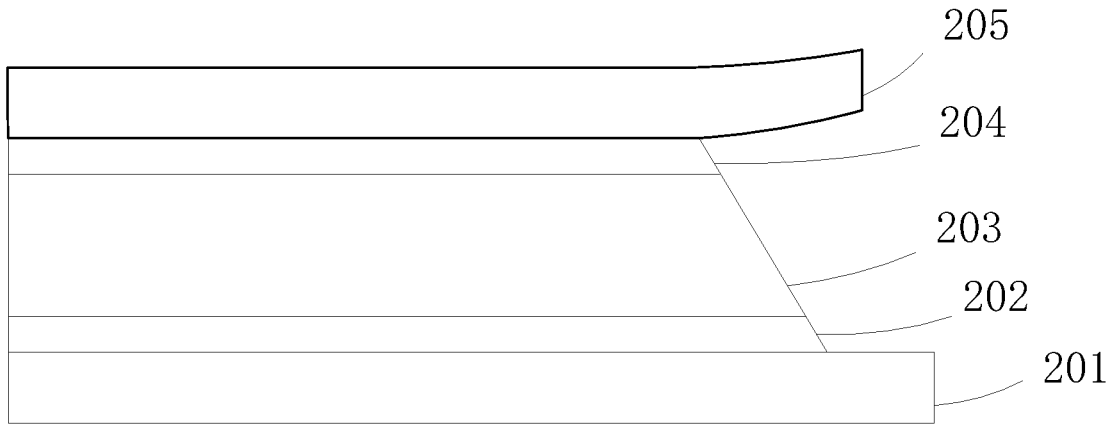
Figure 2F:
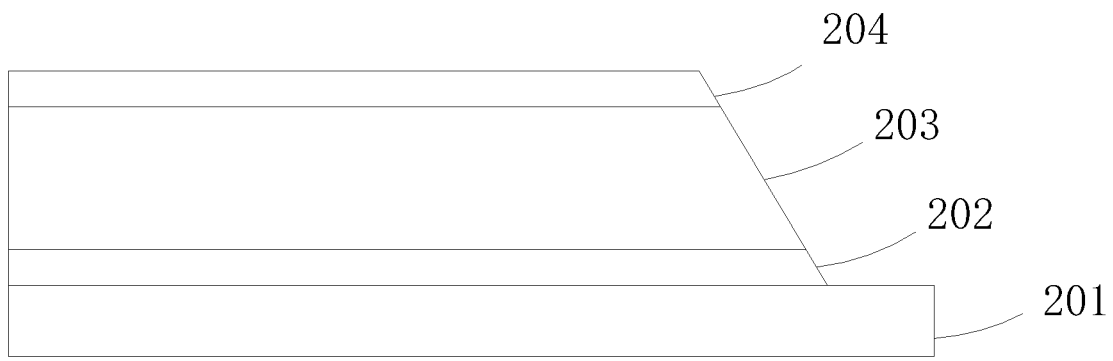

As shown in FIG. 1, which is a flow chart of a manufacturing method of a display panel provided by embodiments of the present application, the manufacturing method includes steps of:

S101, providing a substrate;
S102, forming a first barrier layer on the substrate;
S103, forming a conductive layer on the first barrier layer;
S104, forming a second barrier layer on the conductive layer;
S105, coating a photoresist on the second barrier layer, exposing and developing the photoresist to form a photoresist pattern;
S106, performing a first wet etching on the first barrier layer, the conductive layer, and the second barrier layer to form a first protrusion on an end of the second barrier layer;
S107, performing a plasma treatment on the photoresist pattern to form a first gap between the photoresist pattern and the second barrier layer;
S108, performing a second wet etching on the first barrier layer, the conductive layer, and the second barrier layer; and
S109, stripping off the photoresist pattern.

Wherein the plasma treatment is performed on the photoresist pattern by bombarding the photoresist pattern with a plasma of an inert gas.

In one embodiment, the plasma treatment is performed on the photoresist pattern by bombarding the photoresist pattern with helium plasma or argon plasma.

In one embodiment, wherein a depth of the first gap is equal to a length of the first protrusion, wherein the depth of the first gap can be controlled via a magnetic field strength of the plasma treatment, via plasma density generated by a plasma source, and via treating time.

In one embodiment, a material of the first barrier layer is one or more of molybdenum tantalate, molybdenum titanium, molybdenum, molybdenum niobate, and molybdenum tungsten, and a material of the second barrier layer is one or more of molybdenum tantalate, molybdenum titanium, molybdenum, molybdenum niobate, and molybdenum tungsten.

In one embodiment, a material of the first barrier layer and a material of the second barrier layer are same. For example, both the material of the first barrier layer and the material of the second barrier layer are molybdenum tantalate.

It should be noted that, the manufacturing method of the display panel provided by embodiments of the present application specifically relates to a manufacturing method of a conductive layer in a semiconductor process. In one embodiment, a material of the conductive layer is copper. As adhesive forces between the conductive layer with a substrate (such as a glass substrate) and a silicon dioxide dielectric layer (in subsequent process, covering the conductive layer) are poor when a copper film is configured as the conductive layer, a method of depositing a first barrier layer and a second barrier layer on the bottom and top of the copper film is applied for improving adhesive forces between the copper film with the glass substrate and the silicon dioxide dielectric layer. However, in processes to form a tapered copper film, there is a relatively great etching selectivity between the barrier layer and the copper film, leading to a first protrusion (that is a brim) formed on an interface between the second barrier layer and the middle copper film, which easily leads to a film disconnecting during subsequent preparation of the dielectric layer. In the present application, by bombarding the photoresist with a plasma to solidify the photoresist after the first wet etching, the first gap is formed between the photoresist and the second barrier layer, and then after performing the second wet etching, wherein an etching solution can reach the first gap during the second wet etching, leading to an increased contact area with the first protrusion, the first protrusion (that is the brim) can be effectively removed, phenomena such as cracks and film disconnection during subsequent preparation of the dielectric layer can be prevented, production yield can be improved.

Specifically, as shown in FIG. 2a to FIG. 2f, which are process flow charts of the manufacturing method of the display panel provided by embodiments of the present application, firstly, a composite membrane of a first barrier layer 202, a conductive layer 203, and a second barrier layer 204 is deposited on the substrate 201, a photoresist is then coated on a top surface of the second barrier layer 204, and a photoresist pattern 205 is formed after exposure and development; a first wet etching is immediately performed after, there is a relatively great etching selectivity between the second barrier layer 204 and the conductive layer 203, leading to a formation of a first protrusion 206 formed on an end of the second barrier layer 204, that is to say, the brim is located at an interface between the second barrier layer 204 and the middle conductive layer 203; if the photoresist is stripped off immediately, it is extremely easy for phenomena such as cracks and disconnection of the dielectric layer to happen during subsequent preparation of dielectric layer.

In the present application, by bombarding the photoresist pattern 205 with a plasma to solidify the photoresist pattern 205 after the first wet etching, adhesive force with the second barrier layer 204 decreases, the first gap 207 is formed between an interface of the photoresist pattern 205 and the second barrier layer 204, and the second wet etching is then performed, wherein the etching solution can react with the first protrusion 206 through a side surface of the first protrusion 206 and the an inner surface of the first gap 207, that is to say, a contact area of the etching solution and the first protrusion 206 is increased, so that the first protrusion 206 (brim) can be effectively removed to form a glossy, brim-less three-layer conductive layer structure; stripping off the photoresist pattern 205 thereafter prevents phenomena such as cracks and film disconnection from occurring during subsequent preparation of the dielectric layer.

In one embodiment, the substrate 201 is a glass substrate; a material of the first barrier layer is one or more of molybdenum tantalate, molybdenum titanium, molybdenum, molybdenum niobate, and molybdenum tungsten, a material of the conductive layer 203 is copper; and a material of the second barrier layer 204 is one or more of molybdenum tantalate, molybdenum titanium, molybdenum, molybdenum niobate, and molybdenum tungsten.

In one embodiment, a material of the first barrier layer 202 and a material of the second barrier layer 204 are same. For example, both the material of the first barrier layer 202 and the material of the second barrier layer 204 are molybdenum tantalate.

In one embodiment, the plasma treatment is performed on the photoresist pattern 205 by bombarding the photoresist pattern 205 with the plasma of inert gas.

In one embodiment, the plasma treatment is performed on the photoresist pattern 205 by bombarding the photoresist pattern 205 with helium plasma or argon plasma.

In one embodiment, wherein a depth of the first gap 207 is equal to a length of the first protrusion 206. Wherein the depth of the first gap 207 can be controlled via magnetic field strength of the plasma treatment, via plasma density generated by a plasma source, and via treating time.

Figure 3:
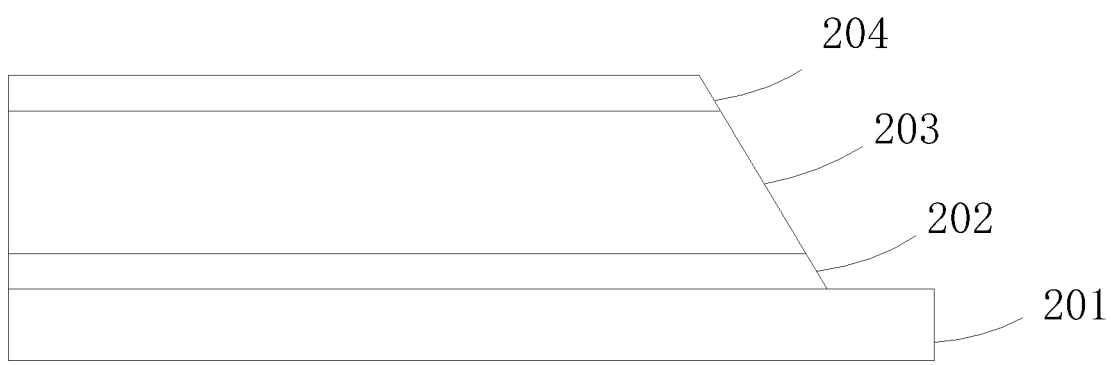
FIG. 3 is a schematic view of a basic structure of a display panel according to embodiments of the present application.

As shown in FIG. 3, which is a schematic view of a basic structure of a display panel according to embodiments of the present application. Each component and the relative position of components of the present application can be directly observed. The display panel comprising a substrate 201, a first barrier layer 202 disposed on the substrate 201, a conductive layer 203 disposed on the first barrier layer 202, and a second barrier layer 204 disposed on the conductive layer 203; wherein a sectional width of the first barrier layer 202, a sectional width of the conductive layer 203, and a sectional width of the second barrier layer 204 decrease in sequence.

It should be noted that a display panel provided by this embodiment is manufactured by the manufacturing method of the display panel shown in FIG. 1, and in one embodiment, the material of the conductive layer 203 is copper. As adhesive forces between the conductive layer with a substrate 201 (such as a glass substrate) and a silicon dioxide dielectric layer (in subsequent process that covers the conductive layer) are poor when a copper film is configured as the conductive layer, a method of depositing a first barrier layer 202 and a second barrier layer 204 on the bottom and the top of the copper film is applied for improving adhesive forces between the copper film with the glass substrate and the silicon dioxide dielectric layer. However, in the processes to form a tapered copper, there is a relatively great etching selectivity between the barrier layer 204 and the copper, leading to a first protrusion (that is a brim) formed on an interface between the second barrier layer and the middle copper film, which easily leads film disconnecting during subsequent preparation of dielectric layer in the present application; by bombarding the photoresist with plasma to solidify the photoresist after the first wet etching, forming the first gap between the photoresist and the second barrier layer, and then performing the second wet etching wherein the etching solution can reach the first gap during the second wet etching, leading to an increase in a contact area with the first protrusion, the first protrusion can be effectively removed. At the same time, a sectional width of the first barrier layer 202, a sectional width of the conductive layer 203, and a sectional width of the second barrier layer 204 are decreased in sequence to form a glossy, brimless, three-layer conductive layer structure, thereby preventing phenomena such as cracks and film disconnecting from occurring during subsequent preparation of the dielectric layer, and improving production yield.

In one embodiment, a material of the first barrier layer 202 is one or more of molybdenum tantalate, molybdenum titanium, molybdenum, molybdenum niobate, and molybdenum tungsten, and a material of the second barrier layer 204 is one or more of molybdenum tantalate, molybdenum titanium, molybdenum, molybdenum niobate, and molybdenum tungsten.

In one embodiment, a material of the first barrier layer 202 and a material of the second barrier layer 204 are same. For example, both the material of the first barrier layer 202 and the material of the second barrier layer 204 are molybdenum tantalate.

A display device is also provided by the present application, comprising a driver chip and the above-mentioned display panels. The display device provided by embodiments of the present application could be any product or component having display function, such as mobile phone, tablet computer, television, display, notebook computer, digital camera, navigator, etc.

Above all, in the manufacturing method of the display panel provided by the present application, by bombarding the photoresist with a plasma after the first wet etching, a gap is formed between the photoresist and a top barrier layer, and then performing the second wet etching to effectively remove a brim formed on the top barrier layer, phenomena such as cracks and film disconnection during subsequent preparation of the dielectric layer can be prevented, production yield can be improved, thus solving the technical problem that in display panels of prior art, when three-layer copper structures are configured as the conductive layer, there is relatively great etching selectivity during the etching processes between the barrier layer and copper, leading to a brim forming at an interface of a tapered top barrier layer and a middle copper after etching, and in the subsequent dielectric layer preparation, the dielectric layer has a poor coverage of the conductive layer, resulting in cracks in the dielectric layer.

It can be understood that for those skilled in the art, equivalent replacements or changes can be made according to the technical scheme of the present application and the invention concept, and all these changes or replacements shall belong to the scope of protection of the claims attached to the application.

What is claimed is:

1. A manufacturing method of a display panel, comprising steps of:
   providing a substrate;
   forming a first barrier layer on the substrate;
   forming a conductive layer on the first barrier layer;
   forming a second barrier layer on the conductive layer, wherein a material of the first barrier layer and a material of the second barrier layer are same;
   coating a photoresist on the second barrier layer, exposing and developing the photoresist to form a photoresist pattern;
   performing a first wet etching on the first barrier layer, the conductive layer, and the second barrier layer, to form a first protrusion on an end of the second barrier layer;
   performing a plasma treatment on the photoresist pattern, to form a first gap between the photoresist pattern and the second barrier layer, wherein a depth of the first gap is equal to a length of the first protrusion;
   performing a second wet etching on the first barrier layer, the conductive layer, and the second barrier layer;
   removing the first protrusion to form a glossy, brim-less three-layer conductive layer structure; and
   after removing the first protrusion, stripping off the photoresist pattern.

2. The manufacturing method of the display panel of claim 1, wherein a material of the conductive layer is copper.

3. The manufacturing method of the display panel of claim 2, wherein a material of the first barrier layer is one or more of molybdenum tantalate, molybdenum titanium, molybdenum, molybdenum niobate, and molybdenum tungsten.

4. The manufacturing method of the display panel of claim 2, wherein a material of the second barrier layer is one or more of molybdenum tantalate, molybdenum titanium, molybdenum, molybdenum niobate, and molybdenum tungsten.

5. The manufacturing method of the display panel of claim 1, wherein the plasma treatment is performed on the photoresist pattern by bombarding the photoresist pattern with a plasma of an inert gas.

6. The manufacturing method of the display panel of claim 5, wherein the plasma treatment is performed on the photoresist pattern by bombarding the photoresist pattern with helium plasma or argon plasma.

* * * * *